(12) United States Patent
Taura (10) Patent No.: US 7,755,017 B2
(45) Date of Patent: Jul. 13, 2010

(54) SOLID-IMAGE-PICKUP DEVICE, IMAGE-PICKUP DEVICE, AND METHOD OF DRIVING SOLID-IMAGE-PICKUP DEVICE

(75) Inventor: Taayuki Taura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/860,196

(22) Filed: Sep. 24, 2007

(65) Prior Publication Data

US 2008/0135729 A1 Jun. 12, 2008

(30) Foreign Application Priority Data

Oct. 13, 2006 (JP) ............................. 2006-279731

(51) Int. Cl.
*H01L 27/00* (2006.01)
*G01J 1/44* (2006.01)
(52) U.S. Cl. .................................. 250/208.1; 250/214 R
(58) Field of Classification Search .............. 250/208.1, 250/214.1, 214 R; 348/573, 302, E3.032, 348/308, 294, 311; 341/164, 155, 118, 158, 341/169, 170; 257/431–440, 290–292
See application file for complete search history.

(56) References Cited

U.S. PATENT DOCUMENTS 7,106,239 B1 * 9/2006 Keskin ........................ 341/157
2005/0195304 A1 * 9/2005 Nitta et al. ................... 348/308
2006/0012698 A1 * 1/2006 Nitta et al. ................... 348/308

OTHER PUBLICATIONS

Woodward Yang et al.; An Integrated 800x500 CMOS Imaging System; ISSCC Digest of Technical Papers; pp. 304-305; Feb. 1999.

* cited by examiner

*Primary Examiner*—Que T Le
*Assistant Examiner*—Jennifer Bennett
(74) *Attorney, Agent, or Firm*—Sonnenschein Nath & Rosenthal LLP (57) ABSTRACT

A method of driving a solid-image-pickup device is provided. The driving method includes the steps of converting light incident on a plurality of pixels arranged in matrix form into an electric signal, selecting and controlling the pixels for each of rows and/or columns, and scanning the pixels in sequence, converting at least one analog signal obtained from at least one of the selected and controlled pixels into a first digital signal, the at least one pixel corresponding to a first group of rows and/or columns, and performing first counting for data on a result of the conversion, and converting at least one analog signal obtained from at least one of the selected and controlled pixels into a second digital signal, the at least one pixel corresponding to a second group of rows and/or columns, and performing second counting for data on a result of the conversion. A period where the first counting is performed is separate from a period where the second counting is performed.

4 Claims, 8 Drawing Sheets

SOLID-IMAGE-PICKUP DEVICE, IMAGE-PICKUP DEVICE, AND METHOD OF DRIVING SOLID-IMAGE-PICKUP DEVICE

CROSS REFERENCES TO RELATED APPLICATIONS

The present invention contains subject matter related to Japanese Patent Application JP 2006-279731 filed in the Japanese Patent Office on Oct. 13, 2006, the entire contents of which are incorporated herein by reference.

BACKGROUND OF THE INVENTION

1. Field of the Invention

The present invention relates to a solid-image-pickup device configured to convert an incident-light amount into an electric signal by using a plurality of pixels arranged in matrix form, an image-pickup device, and a method of driving the solid-image-pickup device.

2. Description of the Related Art

Figure 7:
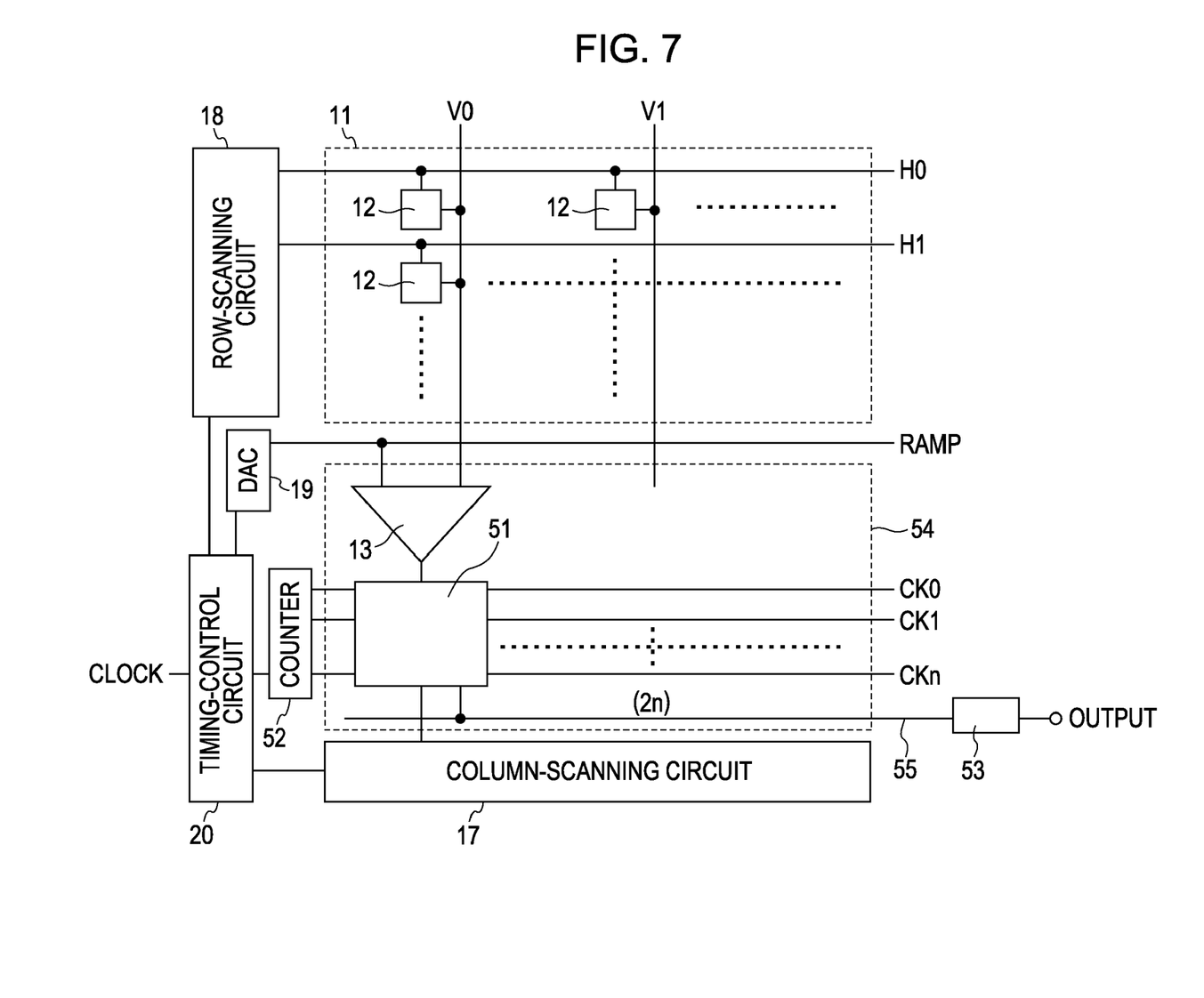
FIG. 7 is a block diagram illustrating a CMOS-image sensor on which a known series/parallel ADC is mounted.

A complementary-metal-oxide-semiconductor (CMOS) image sensor on which a known series/parallel analog-to-digital converter (hereinafter abbreviated as an ADC) is mounted is disclosed in "W. Yang et al., "An Integrated 800× 600 CMOS Image System," ISSCC Digest of Technical Papers, pp. 304-305, February, 1999". FIG. 7 is a block diagram illustrating the configuration of a CMOS image sensor on which the known series/parallel ADC is mounted. Namely, unit pixels 12 including a photodiode and an in-pixel amplifier are arranged in matrix form so that a pixel array 11 is formed.

The ADC includes a comparator 13 configured to compare a reference voltage RAMP generated from a digital-to-analog converter (hereinafter abbreviated as a DAC) 19 to analog signals obtained from the unit pixels 12 for each of row lines H0, H1, and so forth via column lines V0, V1, and so forth, and a memory device 51 storing data on a count result obtained by a counter 52 configured to count a comparison time. The ADC includes an n-bit-digital-signal-conversion function. The comparator 13 and the memory device 51 are arranged for each of the column lines V0, V1, and so forth so that a series/parallel-ADC block 54 is formed.

A horizontal-output line 55 includes a horizontal-output line having a width of 2n bits and the 2n sense circuits corresponding to output lines, a subtraction circuit 53 and an output circuit. Further, a timing-control circuit 20 configured to generate an internal-clock signal, a row-scanning circuit 18 configured to control the row address and/or row scanning, and a column-scanning circuit 17 configured to control the column address and/or column scanning are arranged, as a control circuit used to read signals output from the pixel array 11 in sequence.

Figure 8:
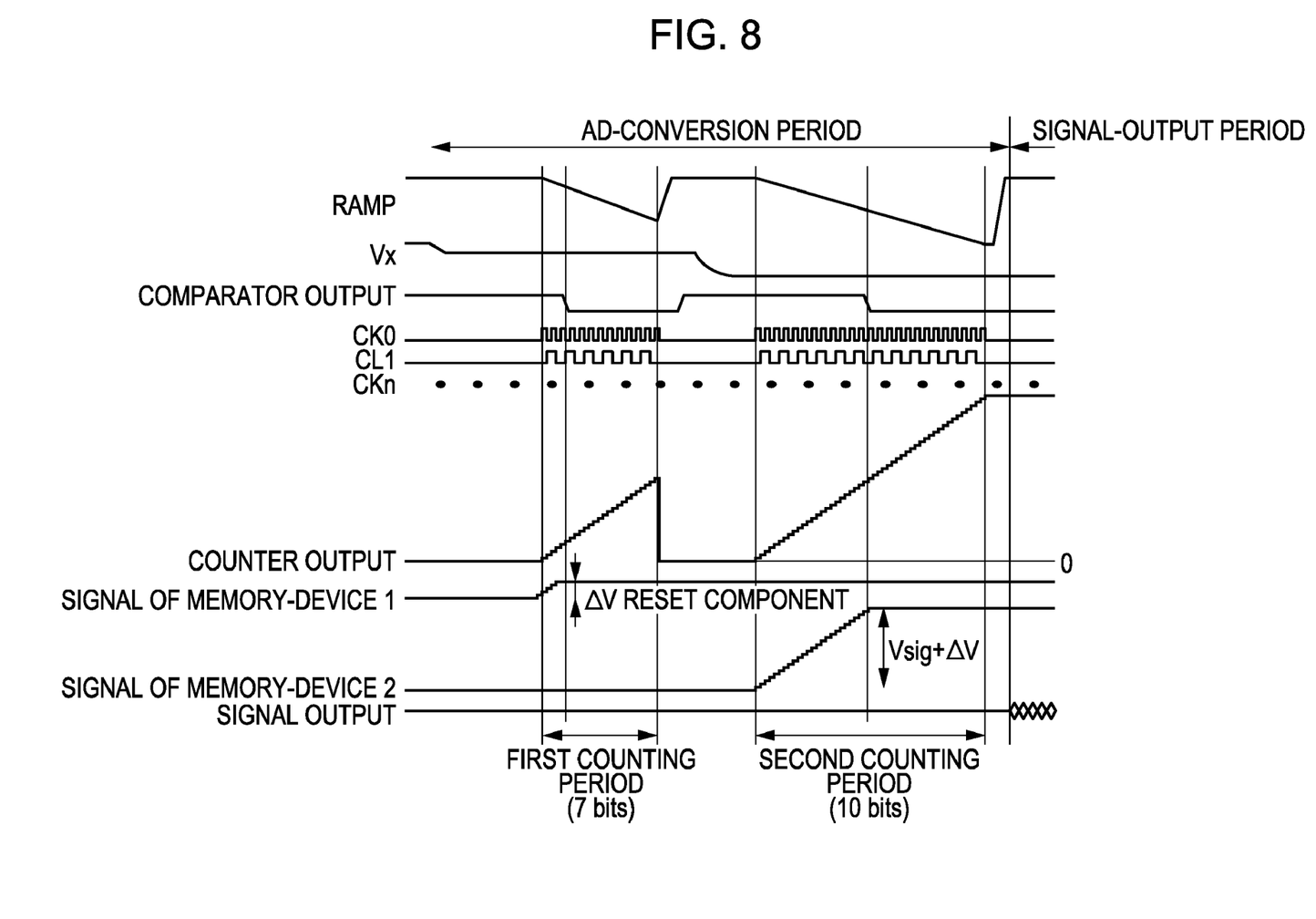
FIG. 8 is a timing chart illustrating operations of the known CMOS-image sensor.

Operations of the above-described known CMOS image sensor will be described with reference to a timing chart of FIG. 8 and the block diagram of FIG. 7. After electric signals are read from the unit pixels 12 provided on an arbitrary row Hx to column lines V0, V1, and so forth for the first time with stability, the DAC 19 inputs a step-like waveform changing with time to a RAMP, as a reference voltage, and the comparator 13 compares the reference voltage to the voltage of the arbitrary column line Vx. At the same time as when the step-like waveform is inputted to the RAMP, the counter 52 performs the first counting.

When the voltage of the RAMP is equivalent to that of the arbitrary column line Vx, an output of the comparator 13 is inverted. At the same time, data on the count value corresponding to the comparison period is stored in the memory device 51. While the first reading is performed, reset components ΔV of the unit pixels 12 are read. Each of the reset components ΔV includes a noise, as an offset component, where the noises vary with the unit pixels 12.

However, since the variations in the noises of the reset components ΔV are usually insignificant and the reset level is common to all of the pixels 12, the value of an output of the arbitrary column line Vx is almost known. Subsequently, the comparison period can be reduced by adjusting the RAMP voltage when the first reading of the reset components ΔV is performed. According to the above-described known example, therefore, a comparison between the reset components ΔV is made over the counting period (128 clock signals) corresponding to 7 bits.

At the second-reading time, the signal components corresponding to an incident-light amount of each of the unit pixels 12 are read in addition to the reset components ΔV, and the same operations as those performed for the first reading are performed. That is to say, after electric signals are read from the unit pixels 12 provided on the arbitrary row Hx to the column lines V0, V1, and so forth for the second time with stability, the DAC 19 inputs the step-like waveform changing with time to the RAMP, as the reference voltage, and the comparator 13 compares the reference voltage to the voltage of the arbitrary column line Vx.

At the same time as when the step-like waveform is inputted to the RAMP, the counter 52 performs the second counting. When the voltage of the RAMP is equivalent to that of the arbitrary column line Vx, an output of the comparator 13 is inverted. At the same time, data on the count value corresponding to the comparison period is stored in the memory device 51. At that time, data on the value of the first counting and that on the value of the second counting are stored in the memory device 51 at different locations.

After the above-described AD-conversion period is over, the column-scanning circuit 17 transmits n-bit digital signals that are obtained by the first counting and that are stored in the memory device 51, and n-bit digital signals that are obtained by the second counting and that are stored in the memory device 51 to the subtraction circuit 53 via 2n horizontal-output lines 55 so that the n-bit digital signals obtained by the first counting are subtracted from the n-bit digital signals obtained by the second counting in sequence and externally transmitted. After that, the above-described operations are performed for each of rows in sequence, so that a two-dimensional image is generated.

SUMMARY OF THE INVENTION

However, the above-described CMOS image sensor has the following problems. Namely, a plurality of clock signals CKi should be transmitted to the counter. Further, when signals are read from the columns, count operations are simultaneously performed for the columns in the same time period, which increases the power consumption. Still further, since the clock signals CKi should be synchronized, the clock speed imposes restrictions on the operations of the CMOS image sensor.

Accordingly, a solid-image-pickup device according to an embodiment of the present invention includes a plurality of pixels arranged in matrix form, the plurality of pixels being configured to convert an incident-light amount into an electric signal, a plurality of first analog-to-digital converters arranged for a first group of rows and/or columns, the first analog-to-digital converters being configured to convert an analog signal obtained from the pixel into a digital signal, a plurality of second analog-to-digital converters arranged for a second group of rows and/or columns, the second analog-to-digital converters being configured to convert another analog signal obtained from the pixel into another digital signal, a plurality of first counters performing counting for a first digital-conversion result obtained by the first analog-to-digital converter, a plurality of second counters performing counting for a second digital-conversion result obtained by the second analog-to-digital converter, and a control device configured to control a first counting period where the first counter performs the counting for the first digital-conversion result and a second counting period where the second counter performs the counting for the second digital-conversion result separately.

According to the above-described embodiment, the first counting period and the second counting period are controlled separately. Therefore, the first counter performs the counting in the first half of a counting period and the second counter performs the counting in the latter half of the same counting period, as complement counting, so that the number of counters simultaneously operating in the same counting period can be reduced.

Thus, according to an embodiment of the present invention, the counter can be provided, as an asynchronous counter, so that only one clock signal should be transmitted, whereby the power consumption is reduced. Further, since clock signals should not be synchronized, the clock speed is not limited. Still further, the counting is performed for a group of column and/or rows in each of the first half and the latter half of the counting period, so that the first-half counting and the latter-half counting are performed in combination. Therefore, the number of counters operating based on the input level can be leveled out and the power consumption can be leveled out.

DESCRIPTION OF THE PREFERRED EMBODIMENTS

Figure 1:
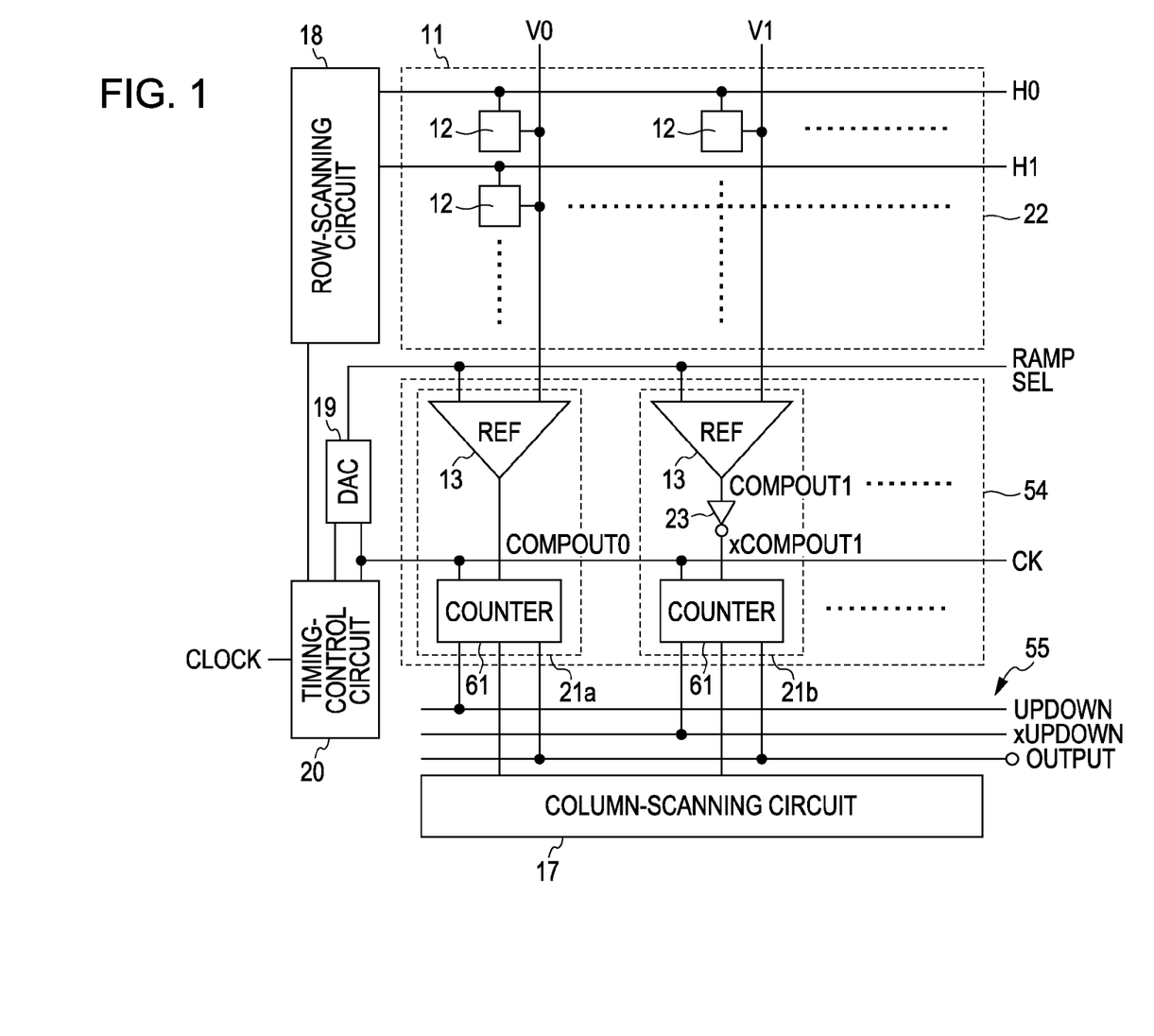
FIG. 1 is a block diagram illustrating a first embodiment of the present invention.

Hereinafter, embodiments of the present invention will be described with reference to the attached drawings. FIG. 1 is a block diagram illustrating a first embodiment of the present invention. In FIG. 1, the same parts as those of the known example will be designated by the same reference numerals.

That is to say, in a solid-image-pickup device (CMOS image sensor) relating to the first embodiment, unit pixels 12 including a photodiode and an in-pixel amplifier are arranged in matrix form, so that a pixel array 11 is formed.

Each of ADCs 21a and 21b includes a comparator 13 configured to compare a reference voltage RAMP generated by a digital-to-analog converter (hereinafter referred to as a DAC) 19 to analog signals obtained from the unit pixels 12 for each of row lines H0, H1, and so forth via column lines V0, V1, and so forth, and asynchronous-up/down counters 61 configured to count comparison time. Each of the ADCs 21a and 21b has an n-bit-digital-signal-conversion function, and either the ADC 21a or the ADC 21b is provided for each of the column lines V0, V1, and so forth, whereby a series/parallel-ADC block 54 is generated.

Particularly, according to the above-described embodiment, each of the ADC 21a and the ADC 21b includes the asynchronous-up/down counter 61 in place of the memory device 51 used in the known example. Further, in contrast to the ADC 21a, the ADC 21b has an inversion circuit 23, and the ADC 21a is provided for an even-numbered column and the ADC 21b is provided for an odd-numbered column, for example, whereby the series/parallel-ADC block 54 is generated. Subsequently, there is an inverse relationship between a comparison signal COMPOUT0 and a comparison signal xCOMPOUT 1 that are output, as a comparison result.

Further, each of a timing-control circuit 20 configured to generate an internal-clock signal, a row-scanning circuit 18 configured to control a row address and/or row scanning, and a column-scanning circuit 17 configured to control a column address and column scanning is provided, as a control circuit configured to read signals transmitted from the pixel array 11 in sequence.

In the above-described CMOS-image sensor, the electric signals corresponding to an incident-light amount captured by the unit pixels 12 provided in the pixel array 11 are read for each of rows at predetermined time determined by the timing-control circuit 20. The read electric signals are counted for each column and output in sequence, as digital signals. In the above-described embodiment, even-numbered columns are determined to be the first group and odd-numbered columns are determined to be the second group, and the digital signals output from the first group and those output from the second group are counted at separate times within the same read period.

Figure 2:
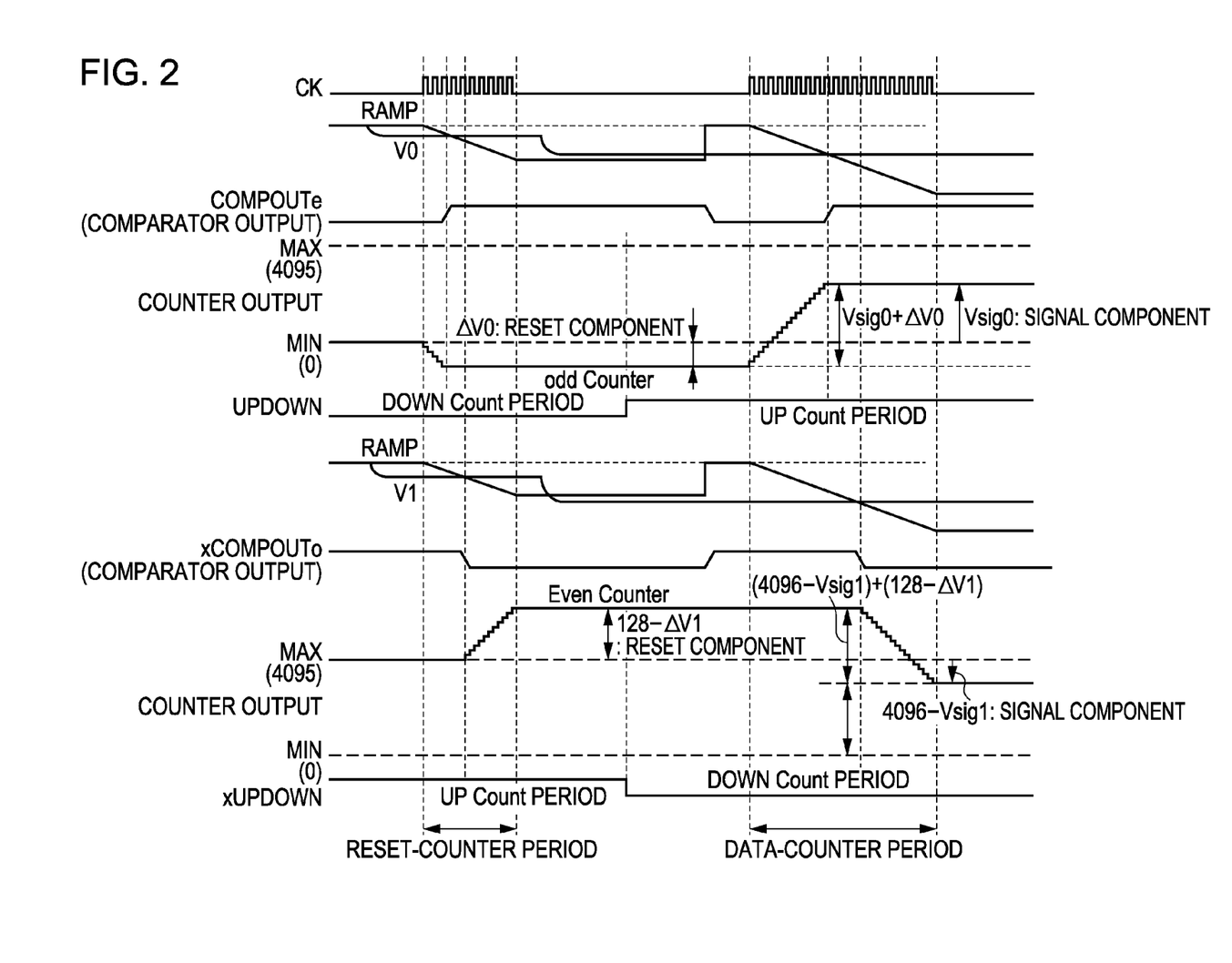
FIG. 2 is a timing chart illustrating operations of a CMOS image sensor according to the first embodiment.

Operations of the CMOS-image sensor according to the above-described embodiment will be described with reference to a timing chart of FIG. 2 and the block diagram of FIG. 1. After electric signals are read from the unit pixels 12 provided on an arbitrary row Hx to column lines V0, V2, and so forth for the first time with stability, a reference voltage RAMP is output from the output end of the DAC 19. The reference voltage RAMP functions, as a reference voltage REF, and is input, as a step-like waveform. The comparator 13 compares the reference voltage REF to the voltage of an arbitrary column line Vx.

First, operations of the ADC 21a will be described. The asynchronous up/down counter 61 is in the down-count state and performs the first reading (reset counting). When the reference voltage REF becomes equivalent to the voltage of the arbitrary column line Vx (e.g., the column line V0), the comparison signal COMPOUT0 output from the comparator 13 (a signal COMPOUTe in FIG. 2) is inverted, down-count operations are stopped, and the count value is stored.

At that time, the initial value of the asynchronous up/down counter 61 is determined to be the minimum value of the gradation of AD conversion, such as "0". During the reset-counter period, the reset component $\Delta V0$ of the unit pixel 12 is read. After that, when the column lines V0, V2, and so forth are stabilized, the second reading (data counting) is performed according to the incident-light amount.

During the data-counter period, the reference voltage RAMP is input, as the reference voltage REF, and the comparator 13 compares the reference voltage REF with the voltage of each of the arbitrary column lines V0, V2, and so forth. At the same time as when the step-like waveform of the reference voltage RAMP is input, each of the asynchronous up/down counters 61 performs up counting. When the value of the reference voltage REF becomes equal to that of the voltage of the column line Vx, the comparison signal COMPOUT0 output from the comparator 13 is inverted and the count value corresponding to the comparison period is stored. The ADC 21a performs count operations in the first half of each of the reset-counter period and the data-counter period.

Next, operations of the ADC 21b will be described. The asynchronous up/down counter 61 is in the up-count state and performs the first reading (reset counting). When the reference voltage REF and the voltage of the arbitrary column line Vx become equivalent to each other, a comparison signal COMPOUT1 output from the comparator 13 is inverted. Further, the asynchronous up/down counter 61 starts performing up-count operations based on an inverted signal xCOMPOUT1 (xCOMPOUT0 in FIG. 2) transmitted from the inversion circuit 23 and the value of a complement obtained during the reset-counter period is stored, as the count value.

At that time, the initial value of the asynchronous up/down counter 61 is determined to be the maximum value of the gradation of the AD conversion, such as "4095". During the reset-counter period, data on the reset component ΔV1 of the unit pixel 12 is read. After that, when the column lines V1, V3, and so forth are stabilized, the second reading (data counting) is performed according to the incident-light amount.

During the data-counter period, the reference voltage RAMP is input, as the reference voltage REF, and a comparator 21 compares the reference voltage REF with the voltage of each of the arbitrary column lines V1, V3, and so forth. At the same time as when the step-like waveform of the reference voltage RAMP is input, each of the asynchronous up/down counters 61 performs down counting. When the value of the reference voltage REF becomes equal to that of the voltage of the column line Vx, the comparison signal COMPOUT1 output from the comparator 13 is inverted. Further, the count value corresponding to the comparison period is stored based on the inverted signal xCOMPOUT1 transmitted from the inversion circuit 23. The ADC 21b performs count operations in the latter half (complement) of each of the reset-counter period and the data-counter period.

Further, the period where the count operations are performed is determined according to the input level (brightness). For example, when the input level is high (well lighted), the ADC 21a that performs the count operations in the first half of the data-counter period performs the count operations over a long time period and the ADC 21b performs the count operations over a short time period. Since the ADC 21a and the ADC 21b complement each other in the above-described manner, the power consumption can be leveled out.

The counter value stored in the asynchronous up/down counter 61 is scanned by the column-scanning circuit 17 and output via a horizontal-output line 55, as a digital signal. After that, the above-described operations are performed for each of the rows in sequence, so that a two-dimensional image is generated.

Figure 3:
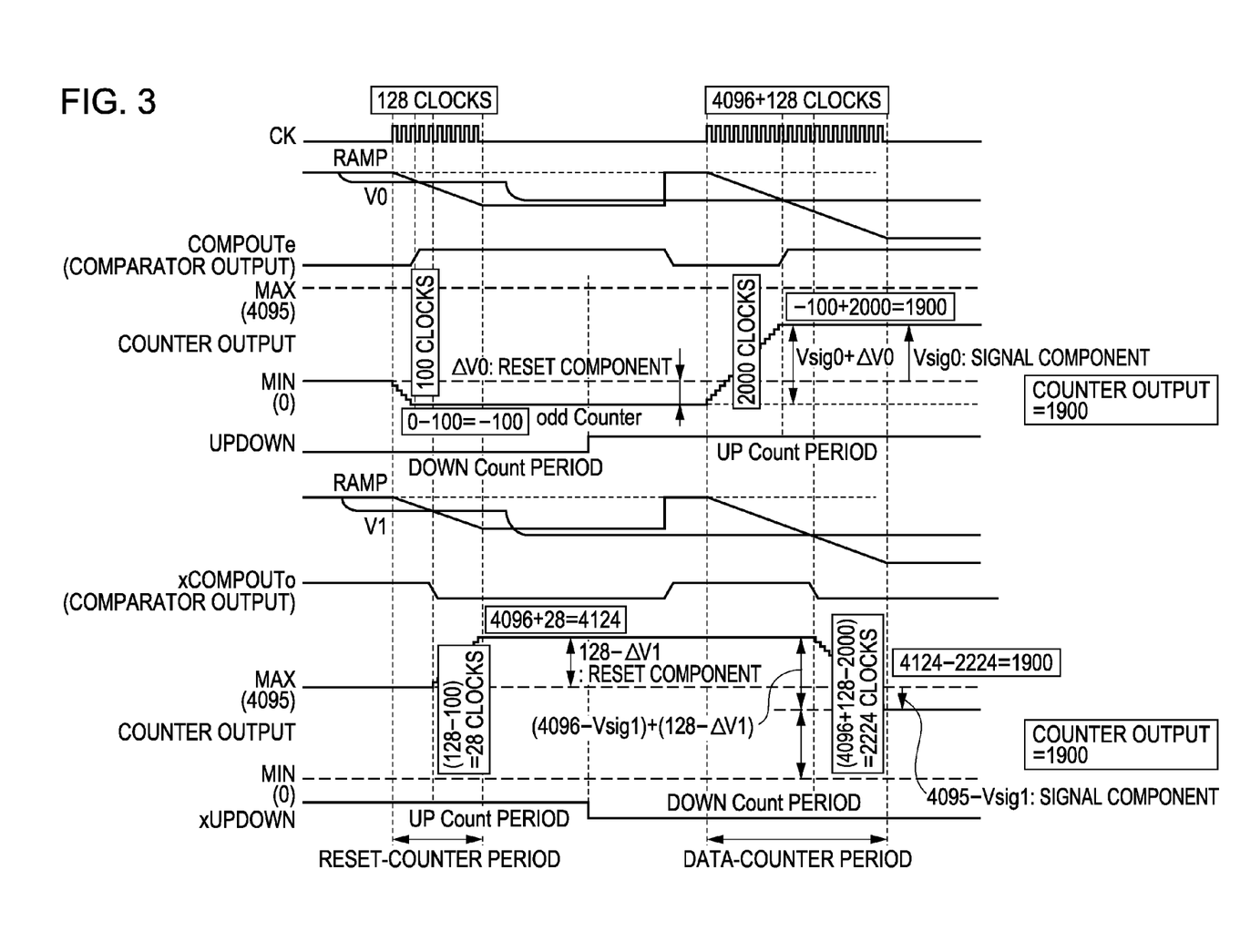
FIG. 3 is a timing chart specifically illustrating the first embodiment.

FIG. 3 is a timing chart specifically illustrating the above-described embodiment. Here, the reset-count value of each of the column lines V0 and V1 is 100, and the data-count value of each of the column lines V0 and V1 is 2000, for example.

First, 128 clock signals prepared, as the reset-counter period, will be described. At the same time as when inputting of the 128 clock signals is started, the comparator 13 compares the reference voltage RAMP and the voltage of the column line V0. Here, since UPDOWN signals inputted to the counter are provided, as a DOWNcount period, down-count operations are performed. Further, since the reset-count value is 100, the comparator output is inverted when the 100-th clock signal is inputted, the down-count operations are stopped, and the count value −100 is stored.

Next, the comparator 13 compares the reference voltage RAMP to the voltage of the column line V1 in the same reset-counter period. Here, since xUPDOWN signals inputted to the counter are provided, as an UPcount period, up-count operations are performed. Further, since a comparator output is inverted by the inversion circuit 23, the up-count operations are started from when the 100-th clock signal is inputted so that the reference voltage RAMP and the voltage of the column line V1 are inverted, and the counting is performed until the 128-th clock signal of the reset-counter period is inputted. Therefore, the expression 128−100=28 holds so that 28 clock signals are stored. Namely, in the first half of the reset-counter period of the column lines V0 and V1, reset components of the column line V0 are counted. Further, in the latter half of the above-described reset-counter period, reset components of the column line V1 are counted. Namely, two reset components are not counted at the same time.

Next, 4096+128 clock signals are prepared in the data-counter period. At the same time as when inputting of the 4096+128 clock signals is started, the comparator 13 compares the reference voltage RAMP to the voltage of the column line V0. Here, since the UPDOWN signals inputted to the counter are provided, as the UPcount period, the up-count operations are performed. Further, since the data-count value is 2000, the comparator output is determined when the 2000th clock signal is inputted and the up-count operations are stopped. At that time, since the reset-counter value −100 is stored, the value of an output of the counter is determined to be 1900 calculated by counting up from −100 by as much as 2000.

Next, the comparator 13 compares the reference voltage RAMP to the voltage of the column line V1 in the same data-counter period. Here, since the xUPDOWN signals inputted to the counter are provided, as the DOWNCount period, down-count operations are performed. Further, since the comparator output is inverted by the inversion circuit 23, the down-count operations are started from when the 2000-th clock signal is inputted so that the reference voltage RAMP and the voltage of the column line V1 are inverted, and the counting is performed until the 4096+128-th clock signal of the reset-counter period is inputted. Therefore, the expression 4096+128−2000=2224 holds so that 2224 clock signals are down-counted. Here, since the value of the reset counter is 4124, the value of an output of the counter is determined to be 1900 calculated by counting down from 4124 by as much as 2224.

Each of the reset-counter period and the data-counter period is divided into the first half period and the latter half period, and the counting is performed for the even-numbered column (such as the column V0) in the first half period and the counting is performed for the odd-numbered column (such as the column V1) in the latter half period. Therefore, two counter groups do not operate at the same time in each of the counter periods, so that the power consumption is reduced.

Figure 4:
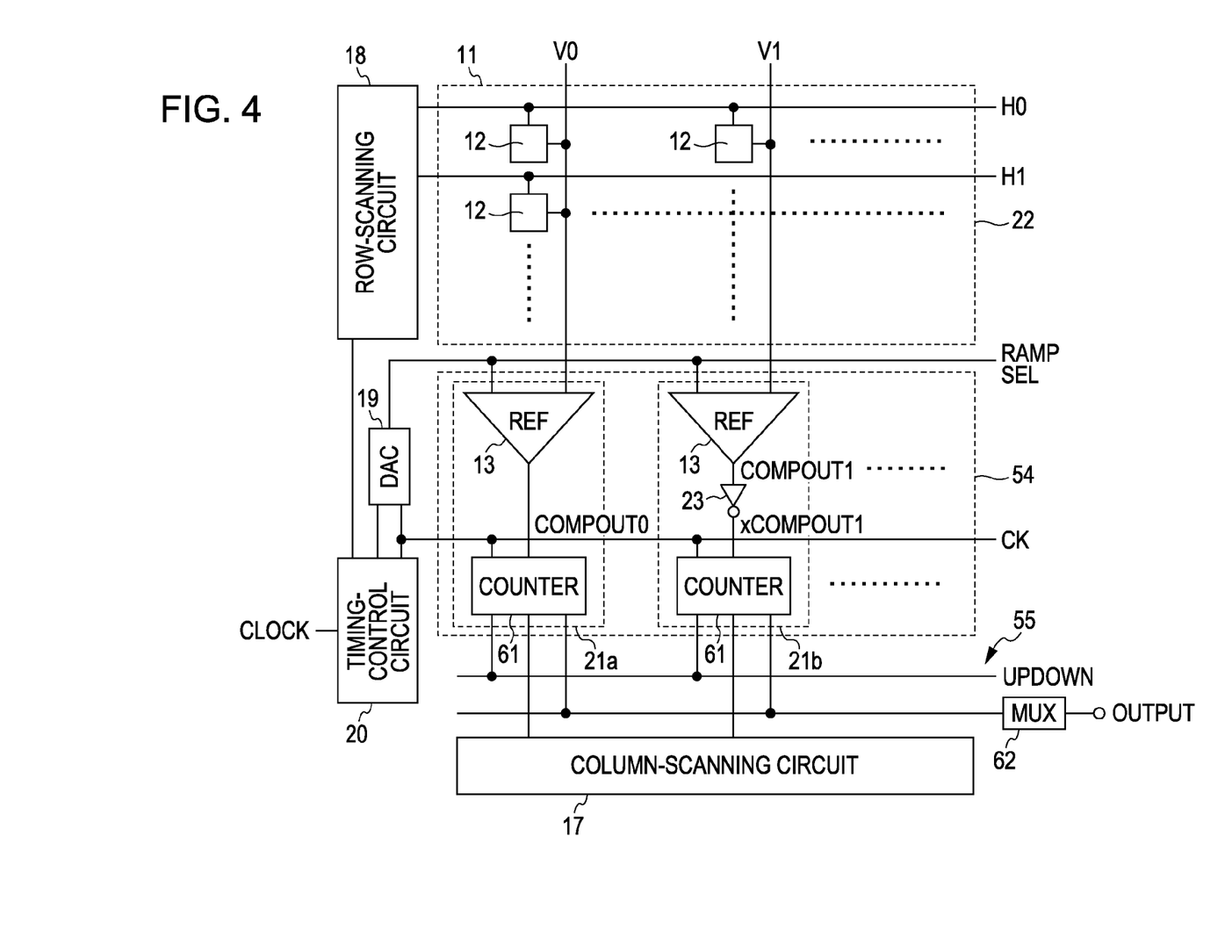
FIG. 4 is a block diagram illustrating a second embodiment of the present invention.

FIG. 4 is a block diagram illustrating a second embodiment of the present invention. As is the case with the first embodiment, a solid-image-pickup device (CMOS image sensor) relating to the second embodiment includes the unit pixels 12 including the photo diode and the in-pixel amplifier. The unit pixels 12 are arranged in matrix form, so that the pixel array 11 is formed.

Further, the solid-image-pickup device relating to the second embodiment is the same as that relating to the first embodiment in that each of the ADCs 21a and 21b includes the comparator 13 configured to compare the reference voltages RAMP generated from the DAC 19 to the analog signals obtained from the unit pixels 12 for each of the row lines H0, H1, and so forth via the column lines V0, V1, and so forth, and the asynchronous-up/down counter 61 configured to count the comparison time. Each of the ADCs 21a and 21b has the n-bit-digital-signal-conversion function, and either the ADC 21a or the ADC 21b is provided for each of the column lines V0, V1, and so forth, whereby the series/parallel-ADC block 54 is generated.

However, the solid-image-pickup device relating to the second embodiment is different from that relating to the first embodiment, as follows. Namely, as for the ADC 21b including the inversion circuit 23, an inversion circuit 62 is provided in the output-side post stage of the asynchronous up/down counter 61. Subsequently, an output obtained through up-counting and an output obtained through down-counting, the outputs being transmitted from the asynchronous up/down counters of the ADCs 21a and 21b, are considered to be the same as each other, and output to a single output line. Then, the inversion circuit 62 inverts and outputs only the output of the ADC 21b based on a timing signal.

Figure 5:
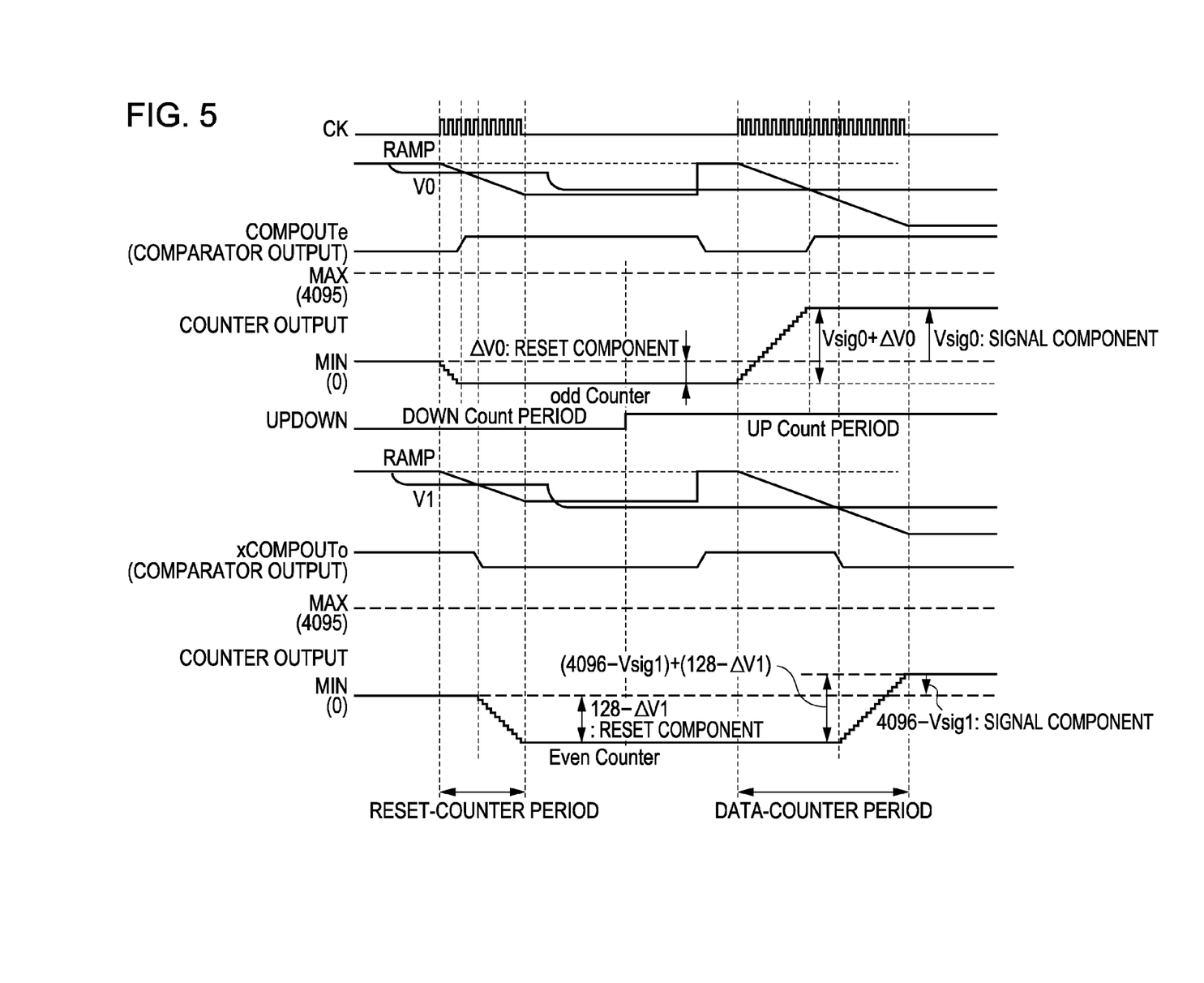
FIG. 5 is a timing chart illustrating operations of a CMOS image sensor according to the second embodiment.

Operations of the CMOS-image sensor according to the above-described embodiment will be described with reference to a timing chart of FIG. 5 and the block diagram of FIG. 4. After electric signals are read from the unit pixels 12 provided on the arbitrary row Hx to the column lines V0, V2, and so forth for the first time with stability, the reference voltage RAMP is output from the output end of the DAC 19. The reference voltage RAMP functions, as the reference voltage REF, and is input, as the step-like waveform. The comparator 13 compares the reference voltage REF to the voltage of the arbitrary column line Vx.

First, operations of the ADC 21a will be described. The asynchronous up/down counter 61 is in the down-count state and performs the first reading (reset counting). When the reference voltage REF becomes equivalent to the voltage of the arbitrary column line Vx (e.g., the column line V0), the comparison signal COMPOUT0 output from the comparator 13 (the signal COMPOUTe in FIG. 5) is inverted so that down-count operations are stopped and the count value is stored.

At that time, the initial value of the asynchronous up/down counter 61 is determined to be the minimum value of the gradation of AD conversion, such as "0". During the reset-counter period, the reset component $\Delta V0$ of the unit pixel 12 is read. After that, when the column lines V0, V2, and so forth are stabilized, the second reading (data counting) is performed according to the incident-light amount.

During the data-counter period, the reference voltage RAMP is input, as the reference voltage REF, and the comparator 13 compares the reference voltage REF with the voltage of each of the arbitrary column lines V0, V2, and so forth. At the same time as when the step-like waveform of the reference voltage RAMP is input, each of the asynchronous up/down counters 61 performs the up-counting operation. When the value of the reference voltage REF becomes equal to that of the voltage of the column line Vx, the comparison signal COMPOUT0 output from the comparator 13 is inverted and the count value corresponding to the comparison period is stored. The ADC 21a performs the count operations in the first half of each of the reset-counting period and the data-counting period.

Next, operations of the ADC 21b will be described. The asynchronous up/down counter 61 is in the down-count state and performs the first reading (reset counting). When the reference voltage REF and the voltage of the arbitrary column line Vx become equivalent to each other, the comparison signal COMPOUT1 output from the comparator 13 is inverted. Further, the asynchronous up/down counter 61 starts performing the down-count operations based on the inverted signal xCOMPOUT1 (xCOMPOUTo in FIG. 5) transmitted from the inversion circuit 23 and the value of a complement of the reset-counter period is stored, as the count value.

At that time, the initial value of the asynchronous up/down counter 61 is determined to be the minimum value of the gradation of the AD conversion, such as "0". During the reset-counter period, data on a complement of the reset component $\Delta V1$ of the unit pixel 12 is read. After that, when the column lines V1, V3, and so forth are stabilized, the second reading (data counting) is performed according to the incident-light amount.

During the data-counter period, the reference voltage RAMP is input, as the reference voltage REF, and the comparator 21 compares the reference voltage REF to the voltage of each of the arbitrary column lines V1, V3, and so forth. At the same time as when the step-like waveform of the reference voltage RAMP is input, each of the asynchronous up/down counters 61 performs the up counting. When the value of the reference voltage REF becomes equal to that of the voltage of the column line Vx, the comparison signal COMPOUT1 output from the comparator 13 is inverted. Further, the count value corresponding to the comparison period is stored based on the inverted signal xCOMPOUT1 transmitted from the inversion circuit 23. The ADC 21b performs the count operations in the latter half (complement) of each of the reset-counter period and the data-counter period.

Further, the period where the count operations are performed is determined according to the input level (brightness). For example, when the input level is high (well lighted), the ADC 21a that performs the count operations in the first half of the data-counter period performs the count operations over a long time period and the ADC 21b performs the count operations over a short time period. Since the ADC 21a and the ADC 21b complement each other in the above-described manner, the power consumption can be leveled out.

The counter value stored in the asynchronous up/down counter 61 is scanned by the column-scanning circuit 17, and output via the horizontal-output line 55, as a digital signal. In that case, only when the counter output corresponds to each of the column lines V1, V3, and so forth, the inversion circuit 62 subtracts the value of the counter output from the maximum value and outputs data on the subtraction result, as the digital signal. After that, the above-described operations are performed for each of the rows in sequence, so that the two-dimensional image is generated.

Figure 6:
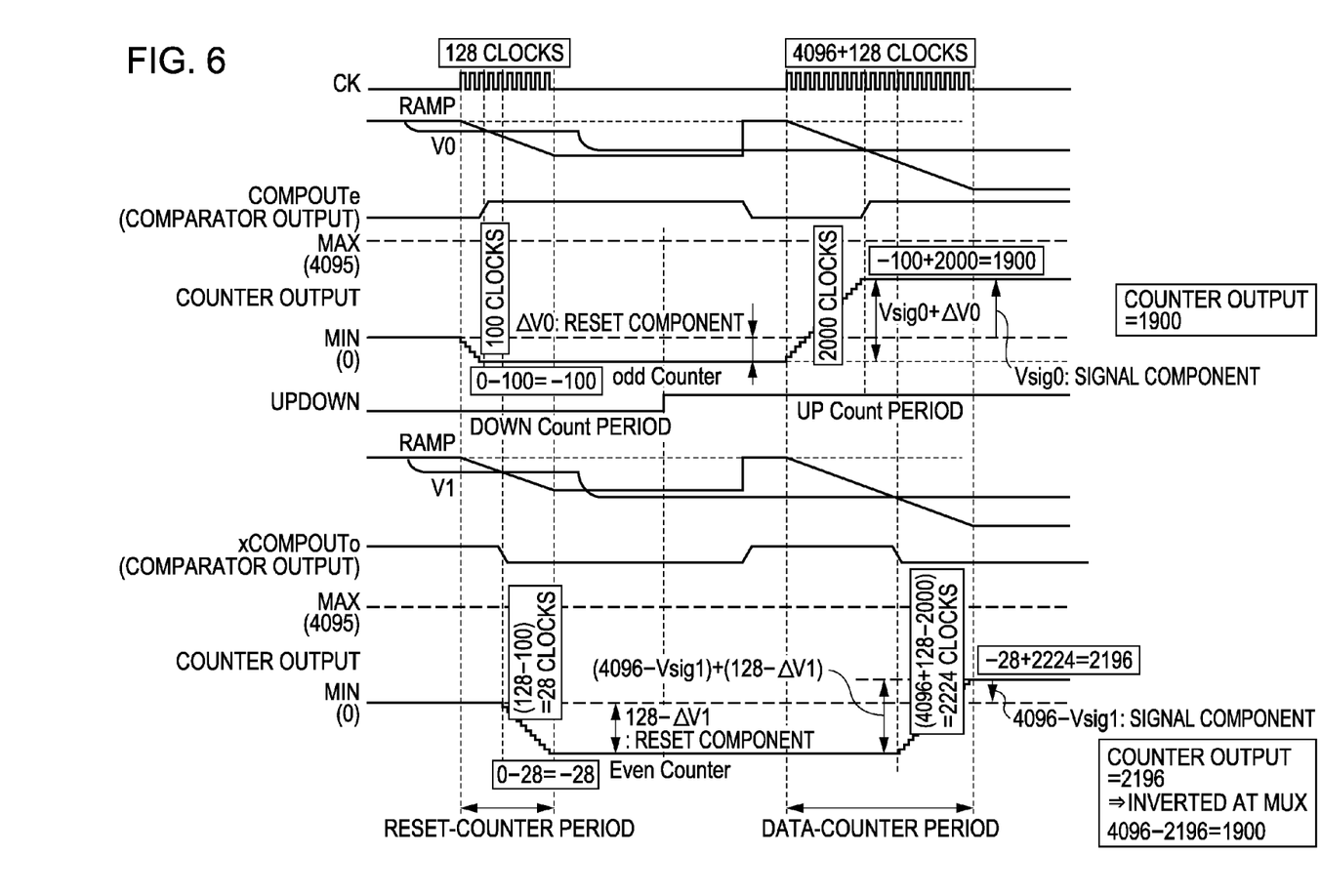
FIG. 6 is a timing chart specifically illustrating the second embodiment.

FIG. 6 is a timing chart specifically illustrating the above-described embodiment. Here, the reset-count value of each of the column lines V0 and V1 is 100, and the data-count value of each of the column lines V0 and V1 is 2000, for example.

First, an example where 128 clock signals are prepared for the reset-counter period will be described. At the same time as when inputting of the 128 clock signals is started, the comparator 13 compares the reference voltage RAMP and the voltage of the column line V0. Here, the down-count operations are performed. Further, since the reset-count value is 100, the comparator output is inverted when the 100-th clock signal is inputted, the down-count operations are stopped, and the count value −100 is stored.

Next, the comparator 13 compares the reference voltage RAMP to the voltage of the column line V1 in the same reset-counter period. When the above-described comparison is made, the comparator output is inverted by the inversion circuit 23. Therefore, the down-count operations are started from when the 100-th clock signal is inputted so that the reference voltage RAMP and the voltage of the column line 1 are inverted, and the counting is performed until the 128-th clock signal of the reset-counter period is inputted. Therefore, the expression 128−100=28 holds so that the down counting is performed by as much as 28 clock signals and the value −28 is stored. Namely, in the first half of the reset-counter period provided for the column lines V0 and V1, the reset components of the column line V0 are counted. Further, in the latter half of the above-described reset-counter period, the reset components of the column line V1 are counted. Namely, two reset components are not counted at the same time.

Next, 4096+128 clock signals are prepared in the data-counter period. At the same time as when inputting of the above-described clock signals is started, the comparator 13 compares the reference voltage RAMP to the voltage of the column line V0. Here, the up-count operations are performed. Further, since the data-count value is 2000, the comparator output is determined when the 2000-th clock signal is inputted and the up-count operations are stopped. At that time, since the reset-counter value −100 is stored, as the counter output, the value of an output of the counter is determined to be 1900 calculated by counting up from −100 by as much as 2000.

Next, the comparator 13 compares the reference voltage RAMP to the voltage of the column line V1 in the same data-counter period. According to the above-described comparison, the comparator output is inverted by the inversion circuit 23. Therefore, the up-count operations are started from when the 2000-th clock signal is inputted so that the reference voltage RAMP and the voltage of the column line V1 are inverted, and the counting is performed until the 4096+128 clock signals corresponding to the data-count period are inputted. Subsequently, the expression 4096+128−2000=2224 holds so that 2224 clock signals are up-counted.

Here, since the value of the reset counter is −28, the value of an output of the counter is determined to be 2196 calculated by counting up from −28 by as much as 2224. Here, the inversion circuit 62 provided in the post stage subtracts the value of the counter output from the maximum value and outputs data on the subtraction result, as the final counter output. The expression 4096−2196=1900 holds so that the counter-output value becomes 1900.

Each of the reset-counter period and the data-counter period is divided into the first half period and the latter half period, and the counting is performed for the even-numbered column (such as the column V0) in the first half period and the counting is performed for the odd-numbered column (such as the column V1) in the latter half period. Therefore, two counters do not operate at the same time in each of the counter periods, so that the power consumption is reduced.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup device comprising:
   a plurality of pixels arranged in matrix form with rows and columns, the plurality of pixels configured to convert an incident-light amount into respective electric signals;
   a plurality of analog-to-digital converters arranged to convert analog signals output from a group of rows and/or columns of the pixels into digital signals,
   one analog-to-digital converter comprising a first comparator and a first counter coupled in series,
   another analog-to-digital converter comprising a second comparator, an inversion circuit and a second counter coupled in series, the inversion circuit being effective to invert the output of the second comparator; and
   a reference voltage generator which generates a ramping voltage signal as a reference signal,
   wherein,
      each comparator compares the analog signal output from a pixel against the reference signal,
      each counter counts a signal output from its respective comparator during a reset counting period and a data counting period,
      the first comparator counts during a portion of the reset counting period and a portion of the data counting period from the beginning of the respective period until the reference signal is equal to the voltage of the analog signal, and
      the second comparator counts during a portion of the reset counting period and a portion of the data counting period from when a voltage of the analog signal becomes equal to the voltage of the reference signal until the end of the respective period.

2. A method of driving a solid state image pickup device, the driving method comprising the steps of:
   converting light incident on a plurality of pixels arranged in matrix form into respective electric signals;
   selecting and controlling the pixels by rows and/or columns, and scanning the pixels in sequence; and
   converting first and second analog signals obtained from at least two of the selected and controlled pixels into digital signals by comparing the analog signals to a ramping reference signal during a counting period and counting time during which said comparison takes place,
   wherein,
      counting of time for said first analog signal takes place from a beginning of a counting period until said first analog signal equals said reference signal, and
      counting of time for said second analog signal takes place from when said second analog signal equals said reference voltage signal until an end of said counting period.

3. The method of claim 2, wherein said counting period is a reset counting period.

4. The method of claim 2, wherein said counting period is a data counting period.

* * * * *

UNITED STATES PATENT AND TRADEMARK OFFICE
CERTIFICATE OF CORRECTION

PATENT NO.       : 7,755,017 B2                                    Page 1 of 1
APPLICATION NO.  : 11/860196
DATED            : July 13, 2010
INVENTOR(S)      : Tadayuki Taura It is certified that error appears in the above-identified patent and that said Letters Patent is hereby corrected as shown below:

On the Title page:

"(75) Inventors: Taayuki Taura, Kanagawa (JP)"

should be

--(75) Inventors: Tadayuki Taura, Kanagawa (JP)--

Signed and Sealed this

Twenty-eighth Day of September, 2010

David J. Kappos
*Director of the United States Patent and Trademark Office*